(12) United States Patent  
Seefeldt et al.

(10) Patent No.: US 7,718,963 B2  
(45) Date of Patent: May 18, 2010

(54) PASSIVE SOLID STATE IONIZING RADIATION SENSOR

(75) Inventors: James D. Seefeldt, Eden Prairie, MN (US); Jeffrey J. Kriz, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 443 days.

(21) Appl. No.: 11/841,432

(22) Filed: Aug. 20, 2007

(65) Prior Publication Data

US 2009/0050814 A1  Feb. 26, 2009

(51) Int. Cl.  
*G01T 1/00* (2006.01)

(52) U.S. Cl. .............................. 250/336.1; 257/E23.114

(58) Field of Classification Search .............. 250/336.1; 257/E23.114  
See application file for complete search history.

(56) References Cited

U.S. PATENT DOCUMENTS

| 5,117,113 | A | 5/1992 | Thomson et al. | 250/370.07 |
|---|---|---|---|---|
| 6,665,161 | B1 | 12/2003 | Brady et al. | 361/78 |
| 6,717,154 | B2 | 4/2004 | Black et al. | 250/393 |
| 6,963,771 | B2 | 11/2005 | Scarantino et al. | 600/436 |
| 7,009,181 | B1 | 3/2006 | Miller et al. | 250/358.1 |
| 7,011,814 | B2 | 3/2006 | Suddarth et al. | 424/9.2 |
| 7,171,312 | B2 | 1/2007 | Steinthal et al. | 702/32 |
| 2004/0016872 | A1* | 1/2004 | Toth et al. | 250/214.1 |
| 2005/0040445 | A1 | 2/2005 | Mouli | 257/290 |
| 2005/0248454 | A1 | 11/2005 | Hanson et al. | 340/539.26 |

* cited by examiner

*Primary Examiner*—David P Porta  
*Assistant Examiner*—Mark R Gaworecki  
(74) *Attorney, Agent, or Firm*—Shumaker & Sieffert, P.A.

(57) ABSTRACT

A radiation sensor and a method for making the radiation sensor are described. An ionizing radiation sensitive area is formed in a radiation insensitive or hardened die. When the sensitive area is impacted by ionizing radiation, properties of the sensitive area change. For example, the changed property may be charge density, threshold voltage, leakage current, and/or resistance. Circuitry for measuring these property changes is located in a radiation hardened area of the die. As a result, a radiation sensor may be fabricated on a single die.

20 Claims, 4 Drawing Sheets

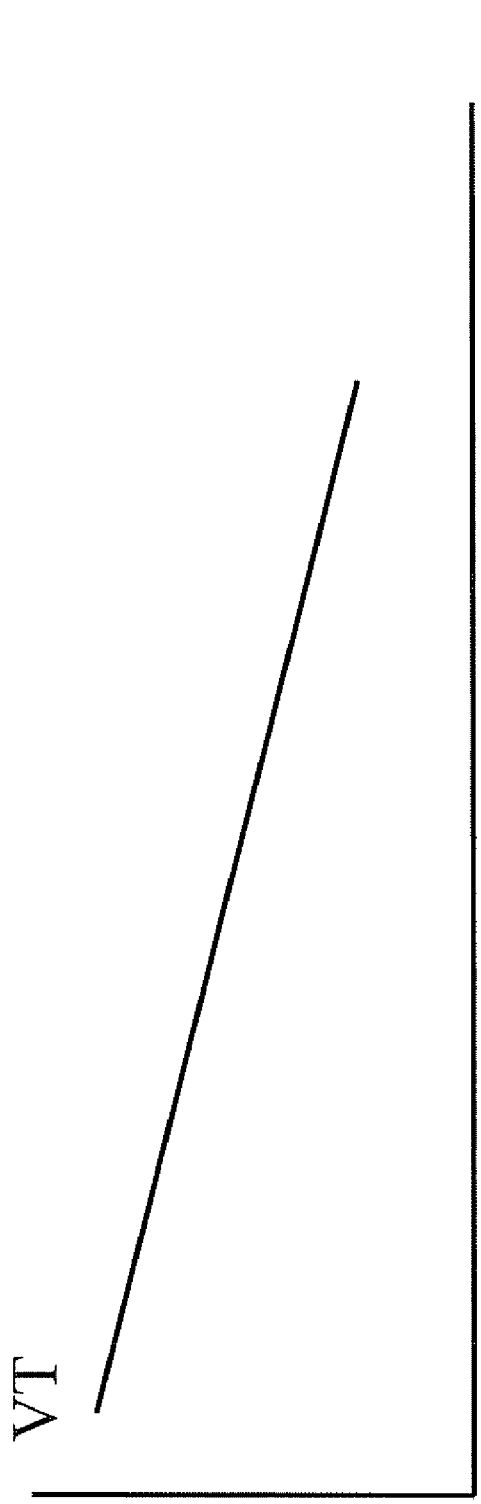
Fig. 3A
Fig. 3B

PASSIVE SOLID STATE IONIZING RADIATION SENSOR

FIELD

The present invention relates generally to radiation sensors, and more particularly, relates to a radiation sensor formed on a die that includes a radiation sensitive area within a radiation insensitive area.

BACKGROUND

Some objects are intentionally radiated with ionizing radiation, such as X-rays and Gamma-rays. For example, medical devices may be radiated for sterilization purposes, food may be radiated to remove microorganisms (e.g., E. coli bacteria), and luggage may be radiated as it moves through security at an airport. However, ionizing radiation may be undesirable in other situations.

Regardless of whether the ionizing radiation is beneficial or not, a radiation sensor may be used to detect whether radiation has occurred or not. If radiation has occurred, some radiation sensors may also determine the amount or dose of radiation to which an object has been exposed. Typically, a radiation sensor is placed on or near the object or person likely to be exposed to radiation.

Thermoluminescent devices (TLDs) and chromatic tags are common radiation sensors. TLDs may generally be described as crystals, e.g., lithium floride, whose structure changes during exposure to radiation. More particularly, during irradiation, electrons travel to and are trapped in the crystal after being ejected by the high-energy (ionizing) photons used for sterilization. Upon exposure to heat, the electrons in the crystal fall back to their ground states and emit light as result of the change. A spectrophotometer measures this light and provides a quantitative assessment of the amount of radiation to which the device was exposed. A technician typically recovers the TLD from an irradiated package and then analyzes/measures the emitted light on the spectrophotometer. Unfortunately, this process can be relatively labor-intensive and can be undesirable for use in a mass production environment.

Chromatic tags may generally be described as plastic tags that undergo a color change upon exposure to radiation at some level. A technician may visually evaluate the color change. Colormetric readers may also be used to quantify the color change to a more exact level. Unfortunately, again, the determination of the dose measured in this manner can also be labor intensive and/or unsuitable for a mass-production environment.

Some radiation sensors use circuits that react in a measurable way to ionizing radiation. For example, a tank circuit may be used as a radiation sensor. When the tank circuit is exposed to radiation, the radiation affects the operational properties of the tank circuit and these changes may be transmitted to a remote detection circuit, which can then determine the radiation dose. The detection circuit is located at a remote location so that this circuit is not impacted by the radiation. While these sensors are more suitable for mass-production, they are typically single use, disposable sensors.

As a radiation sensor may have many applications and be required in large quantities, it would be beneficial to have a sensor that is inexpensive, compact, noninvasive, and operates passively, i.e., requires no power to detect radiation. Moreover, it would beneficial to provide an ionizing radiation sensor and associated detection circuitry in a single package.

SUMMARY

A radiation sensor and method for fabricating the radiation sensor on a single die is described. The radiation sensor includes a radiation hardened die and a radiation sensitive area formed in the radiation hardened die. A property of the radiation sensitive area changes when exposed to ionizing radiation and circuitry in a radiation hardened area of the radiation hardened die detects the property change.

The property of the radiation sensitive area that changes when exposed to the ionizing radiation may be selected from the group consisting of charge density, threshold voltage, leakage current, and resistance.

The circuitry may provide an output related to total ionizing dose. Additionally, the circuitry in the radiation hardened area may include circuitry for transmitting the detected property change to a device remote from the die. The circuitry in the radiation hardened area may also include a data storage device.

The method for fabricating a radiation sensor on a single die includes providing a radiation hardened die, forming a radiation sensitive area in the radiation hardened die, and forming circuitry in a radiation hardened area of the radiation hardened die operable to detect the property change. A property of the radiation sensitive area changes when exposed to ionizing radiation.

Forming a radiation sensitive area in the radiation hardened die may include damaging interconnect oxide by means of a masked implantation, electric field induced damage by means of a parallel plate capacitor in a metal stack, deposition of an ionizing radiation sensitive material on a die, deposition and etch of an ionizing radiation sensitive material on a die, assembly of an ionizing radiation sensitive material with the radiation hardened die using wafer to wafer bonding methods, and/or assembly of an ionizing radiation sensitive material with the radiation hardened die using fluid fabrication methods.

In another example, the method for fabricating a radiation sensor on a single die includes providing a radiation insensitive die, implanting ions in a portion of the radiation insensitive die forming an sensitive area in the radiation insensitive die, and forming circuitry in the radiation insensitive die operable to detect a property change in the sensitive area when exposed to radiation. A photoresist may be used to implant the ions in the portion of the radiation insensitive die.

The ion implantation may cause a parasitic transistor to form in the sensitive area. The parasitic transistor may cause threshold voltage to reduce as charge increases in the sensitive area. In this example, the circuitry detects changes in the threshold voltage. The parasitic transistor may cause leakage current to increase as charge increases in the sensitive area. In this example, the circuitry detects changes in the leakage current.

The ion implantation may cause damage to an oxide layer under a device layer in the sensitive area. The damaged oxide layer may cause a change in resistance as charge increases in the sensitive area. In this example, the circuitry detects the change in resistance.

The method may also include forming circuitry operable to transmit the detected property change to a device remote from the radiation insensitive die.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein:

FIG. 3A is a graph depicting threshold voltage linearly decreasing as a function of charge, according to an example;

FIG. 3B is a graph depicting leakage current increasing exponentially as a function of charge, according to an example;

DETAILED DESCRIPTION

Figure 1:
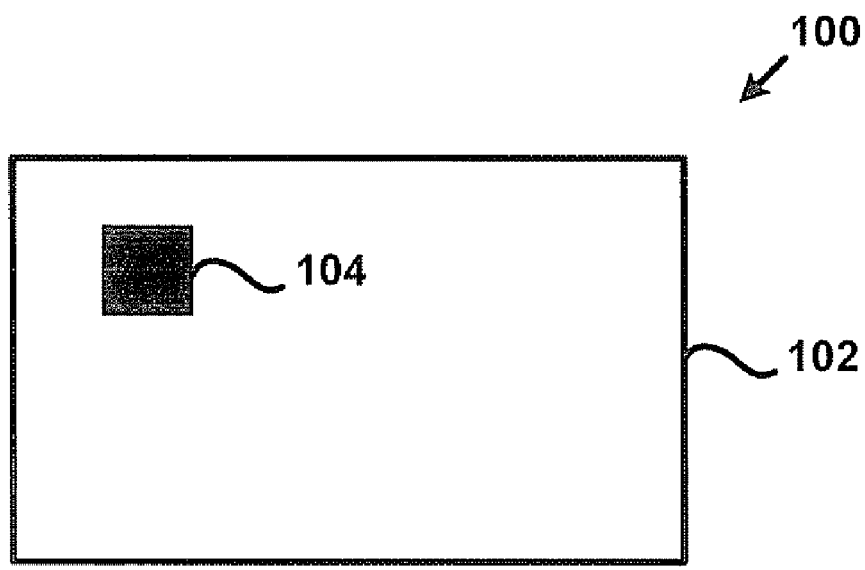
FIG. 1 is a top view of a die for a radiation sensor having a first area that is radiation hardened and a second area that is sensitive to radiation, according to an example.

FIG. 1 is a die 100 for a radiation sensor. The die 100 includes two areas 102, 104. The first area 102 is the portion of the die 100 that includes electronics for the radiation sensor and any support circuitry. The second area 104 is the portion of the die 100 that includes an ionizing radiation sensitive area. The second area 104 is formed in the first area 102 and is significantly smaller than the first area 102.

The first area 102 is fabricated using radiation hard semiconductor process technologies. For example, the semiconductor devices fabricated in the area 102 may be processed with Honeywell's SOI4, SOI5, or S150 process technologies, or any other radiation hard technologies now known or developed in the future. As a result, the circuitry formed in the first area 102 may not impacted by radiation.

The second area 104 is formed in the die 100 by a process that allows the area 104 to detect exposure to ionizing radiation. When exposed to radiation, the area 104 becomes charged. The charge density in the second area 104 may be proportional to the total ionizing dose (TID) and may be used to determine whether the second area 104 is exposed to radiation, and if so, the radiation dose.

The charged area may be sensed by an appropriate charge sensitive structure, such as a light to moderate a doped semiconductor region under the charged area. The charge modifies the resistance on this semiconductor region in the same manner as a voltage on a gate of a MOS transistor modifies the conductivity of the semiconductor body under the gate. Circuitry on the die 100 in the first area 102, i.e., in the area not sensitive to ionizing radiation may be used to measure the conductivity change in the semiconductor region under the charge area.

Additionally, circuitry in the area 102 may be used to transmit the measurement results. The circuitry used to transmit the results may vary widely depending on the transmission technique employed. For example, the results may be transmitted using a standard analog or digital hardwired connection or via radio frequency waves using, for example, an RFID device.

One or more data storage devices may also be located in the area 102. The data storage device may be any memory type, such as ROM, RAM, PROM, EEPROM, and so on. Preferably, the data storage device has non-volatile memory elements. The data storage device may be used to store exposure data, correlation curve data, and/or environmental data, such as temperature data.

The die 100 may be packaged to form a radiation sensor. The radiation sensor may be attached to or imbedded in the object to be monitored. The radiation sensor may then be electronically queried to verify ionizing radiation exposure and total dose of the radiation. Additional details regarding forming the second area 104 and the circuitry formed in the first area 102 are further described as follows.

The radiation sensor may be used as a single-use sensing device. Alternatively, the radiation sensor may be reused by draining the charge by annealing. For example, a used radiation sensor may be baked in an oven, for example, at a temperature of 150° C. or greater. If the anneal process does not remove all of the charge, the radiation sensor may be reused by adjusting a reference voltage in the measurement circuitry.

The ionizing sensitive area located in the second area 104 of the die 100 may be formed in a variety of different manners. For example, the ionizing sensitive area may be fabricated by: selectively damaging interconnect oxide by means of masked implantation; electric field induced damage by means of a parallel plate capacitor in the metal stack; selective deposition and/or deposition and etch of an ionizing radiation sensitive material on a die; and high volume assembly of an ionizing radiation sensitive material with a radiation insensitive ASIC using wafer to wafer bonding or fluid fabrication methods. Other methods of forming an ionizing sensitive area in the die 100 may also be used. Preferably, the ionizing sensitive area is formed as depicted in FIG. 2.

Figure 2:
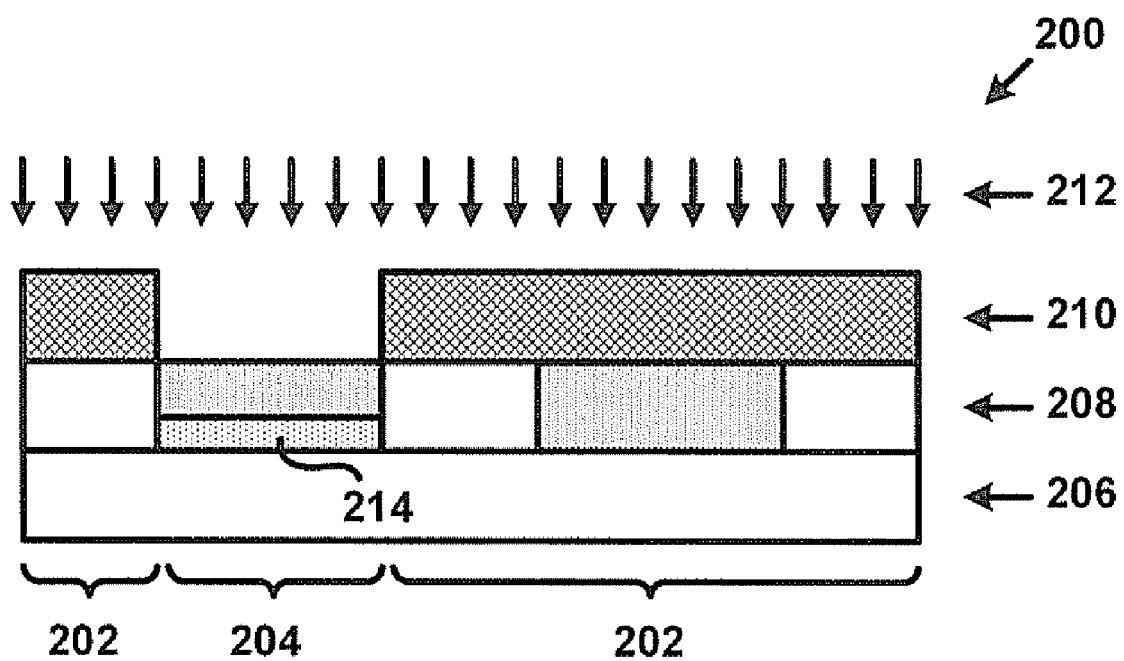
FIG. 2 is a side view of a die having a first area that is radiation hardened and a second area that is sensitive to radiation, according to an example.

FIG. 2 shows a side view of a die 200. The die 200 has two areas 202, 204. The area 202 is an area that is hardened to radiation, while the area 204 is fabricated within the area 202 to be sensitive to radiation.

The die 200 may be a silicon-on-insulator (SOI) die that includes an oxide layer 206 and a device layer 208. The device layer 208 may include a variety of devices, such as transistors, resistors, capacitors, and diodes. For example, high voltage n-type field effect transistors (HVNFETs) may be located in device layer 208. Prior to forming the sensitive area 204 in the die 200, the die 200 may be radiation hardened.

A photoresist layer 210 is deposited on the device layer 208 to form the sensitive layer 204 in the die 200. The pattern of the photoresist layer 210 is such that only the area to be formed as the sensitive area 204 is not covered. In other words, the photoresist layer 210 covers the area that remains as the radiation hardened area 202.

An ion implant 212 is deposited on the die 200; however, due to the photoresist layer 210, only the sensitive area 204 is impacted by the ion implant 212. A typical implant would be Phosphorus at a dose of 1e12 to 1e13 atoms/cm$^2$ at 40 to 80 Kev; however, other implants may also be used. The ion implant 212 causes a parasitic transistor 214 to form under the device layer 208 in the sensitive area 204. The photoresist layer 210 may then be removed as well known in the art.

The parasitic transistor 214 causes the threshold voltage Vt to reduce as charge increases in the sensitive area 204. For example, the ion implant 112 may control the backside threshold voltage of an HVNFET well region from 15 volts to 7 volts during ionizing radiation, down to 10 volts to less than zero volts during ionizing radiation. As the threshold voltage decreases, the leakage current (i.e., drain to source) increases.

FIG. 3A is a graph depicting threshold voltage linearly decreasing as a function of charge, while FIG. 3B is a graph depicting leakage current increasing exponentially as a function of charge. By measuring either the threshold voltage or the leakage current, the amount of charge in the sensitive area 204 may be determined. These measurements of the threshold voltage or the leakage current may be used to determine whether the sensitive area 204 is exposed to radiation, and if so, the TID.

The circuitry used to measure the impact of the increased charge in the sensitive area 204 is preferably formed in the radiation hardened area 202. As a result, the measurement circuitry may not be impacted by the ionizing radiation that the sensor is designed to detect. While any circuitry may be used to measure the threshold voltage and/or the leakage current, an example circuit for measuring the leakage current is depicted in FIG. 4.

Figure 4:
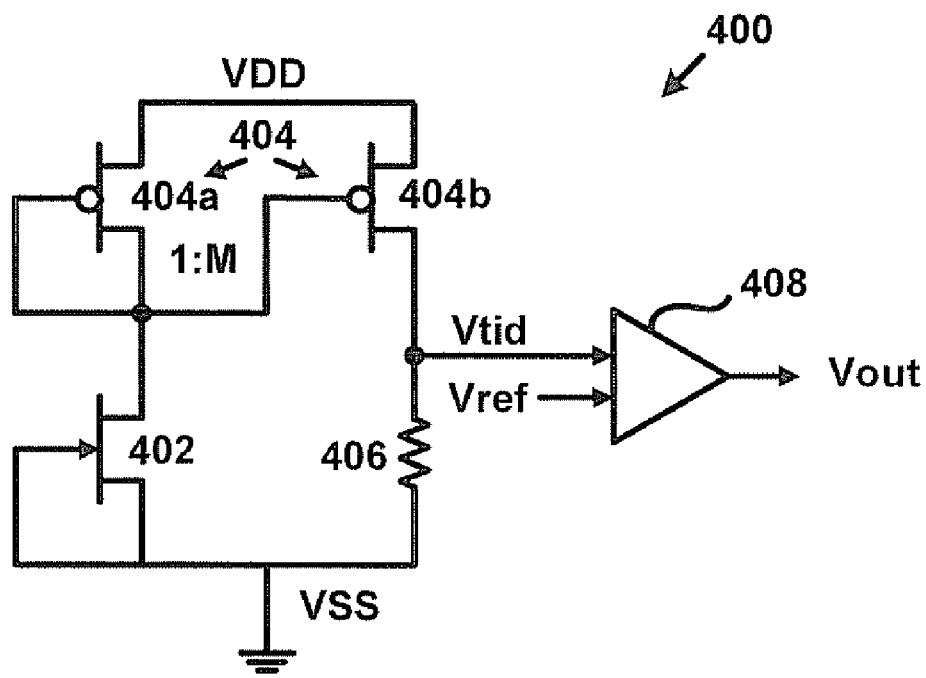
FIG. 4 is a circuit diagram of a circuit for measuring leakage current, according to an example.

FIG. 4 is a circuit diagram of a circuit 400 for measuring leakage current. The circuit 400 includes an input transistor 402, a current mirror 404, a resistor 406, and a comparator 408. The transistor 402 is the parasitic transistor 214 formed in the oxide layer 208. A typical resistor for this application would have a sheet resistance of around 700 ohms/square and a resistance of 10K ohms.

The current mirror 404 includes two transistors 404a, 404b. The transistors 404a, 404b may be any type of transistor. In operation, the current flowing through the first transistor 404a is mirrored through the second transistor 404b. The second transistor 404b is typically larger than the first transistor 404a by an integer multiple of M, which amplifies the increase in current seen in the transistor 402 due to exposure to TID radiation.

The voltage at the node Vtid is compared to a reference voltage Vref using the comparator 408. A typical reference voltage Vref would be between 0.5 and 1.2V; however, other voltages may be used. The comparator 408 may be a digital or analog comparator. Preferably, the comparator 408 is a multi-bit comparator.

The input transistor 402 is biased in a normally off state. As the TID shifts, the leakage current increases (see, e.g., FIG. 3B). As the leakage current increases, the voltage Vtid increases. When Vtid exceeds Vref, Vout transitions from low to high. In this way, the circuit 400 may be used as a trip-level circuit to either indicate that an object has received too much or too little radiation. The circuit 400 may also be used to measure long-term exposure.

The signal Vout may be transmitted (wirelessly or using a wired connection) using circuitry formed in the radiation hardened area 202 of the die 200. The transmitting circuitry may be analog and/or digital circuitry. For example, the output of the comparator 408 may be connected to a transmitter, which may wirelessly transmit Vout to a remote location for monitoring.

Figure 5:
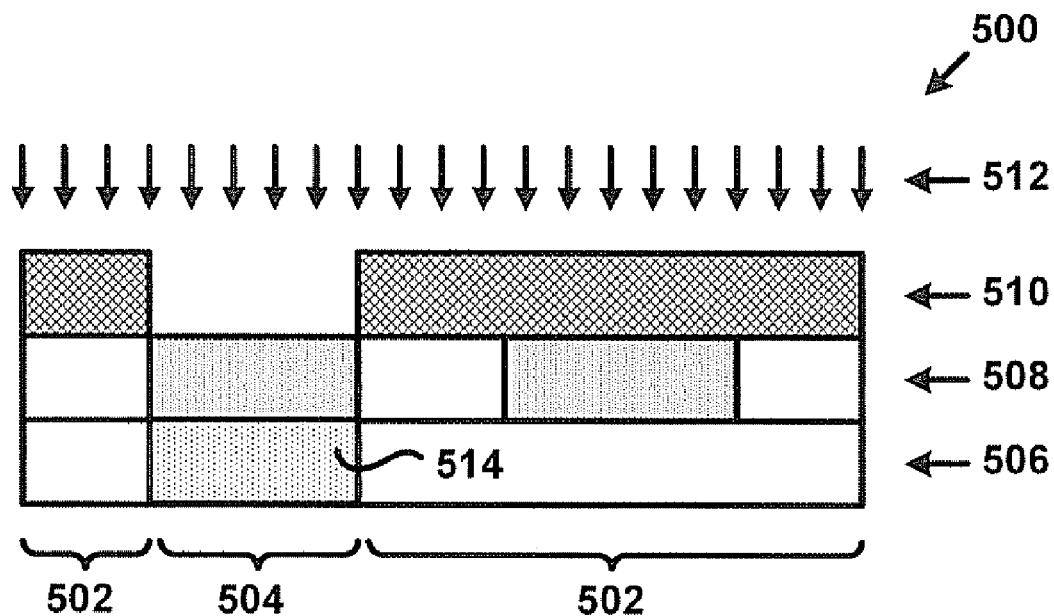
FIG. 5 is a side view of a die having a first area that is radiation hardened and a second area that is sensitive to radiation, according to another example.

Another example for forming a radiation sensitive area within a radiation hardened die is described with reference to FIG. 5. FIG. 5 is a side view of a die 500. The die 200 has two areas 502, 504. The area 502 is an area that is hardened to radiation, while the area 504 is fabricated within the area 502 to be sensitive to radiation.

The die 500 may be a silicon-on-insulator (SOI) die that includes an oxide layer 506 and a device layer 508. The device layer 508 may include a variety of devices, such as transistors (e.g., NPN or PNP Bipolar, N or P FET MOS, or other types of Field Effect Transistors, such as MESFET or JFET), resistors, capacitors, and diodes. Prior to forming the sensitive area 504 in the die 500, the die 500 may be radiation hardened.

A photoresist layer 510 is deposited on the device layer 508 to form the sensitive layer 504 in the die 500. The pattern of the photoresist layer 510 is such that only the area to be formed as the sensitive area 504 is not covered. In other words, the photoresist layer 510 covers the area that remains as the radiation hardened area 502.

An ion implant 512 is deposited on the die 500; however, due to the photoresist layer 510, only the sensitive area 504 is impacted by the ion implant 512. A typical implant would be Oxygen at a dose of 1e15 to 1e16 atoms/cm$^2$ at 80 to 120 Kev; however, other implants may also be used. The ion implant 512 causes damage 514 to the oxide layer 506 under a resistor in the device layer 508. The photoresist layer 510 may then be removed as well known in the art.

As a result of the damage 514 to the oxide layer 506 in the sensitive layer 504, ionizing radiation shifts the resistance value. For example, with an n-type implant, resistance decreases due to radiation. This change in resistance can be measured to determine TID. While any circuitry may be used to measure the resistance shift, an example circuit for measuring this change is depicted in FIG. 6.

Figure 6:
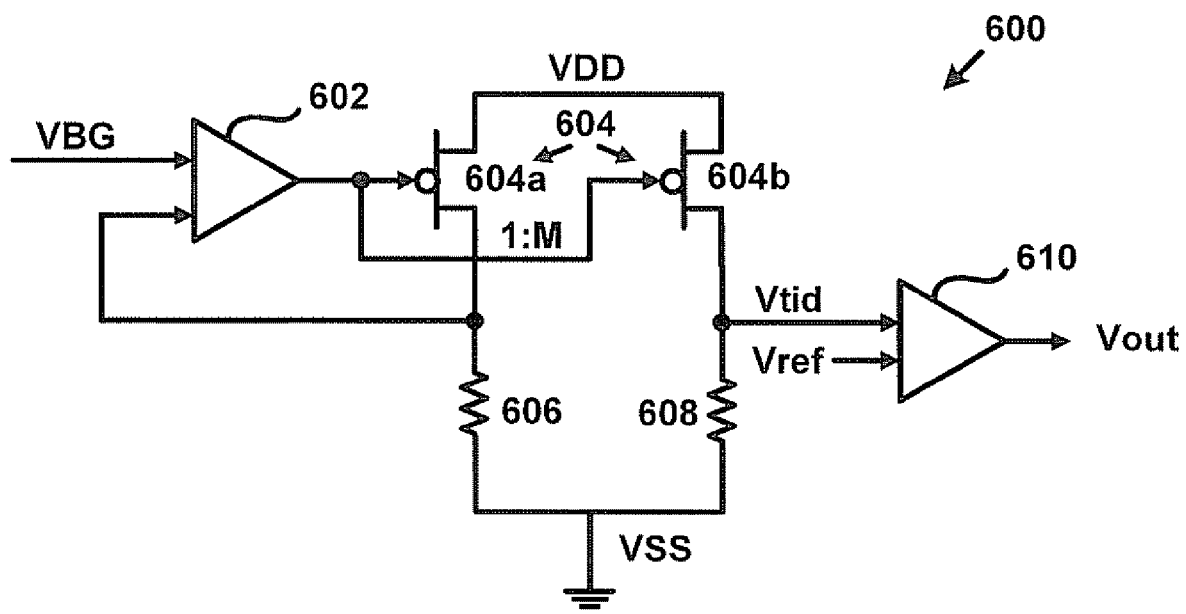
FIG. 6 is a circuit diagram of a circuit for measuring resistance change, according to an example.

FIG. 6 is a circuit diagram of a circuit 600 for measuring resistance change. The circuit 600 includes a bandgap voltage reference circuit 602, a current mirror 604, a first resistor 606, a second resistor 608, and a comparator 610. The first resistor 606 is the resistance caused by the damage 514 in the oxide layer 506 in the sensitive area 504. For example, the second resistor 608 may be 100K Ohms; however, other resistance values may also be used.

The bandgap voltage reference circuit 602 is a voltage reference circuit that provides an output voltage close to the theoretical bandgap of silicon at 0° K. Typically, the output voltage is around 1.25 V. Bandgap voltage reference circuits are well known in the art and any suitable design may be used for the circuit 602.

The current mirror 604 includes two transistors 604a, 604b. The transistors 604a, 604b may be any type of transistor. In operation, the current flowing through the first transistor 604a is mirrored through the second transistor 604b. The second transistor 604b is typically larger than the first transistor 604a by an integer multiple of M, which amplifies the increase in current seen in resistor 606 due to exposure to TID radiation.

The voltage at the node Vtid is compared to a reference voltage Vref using the comparator 610. A typical Vref would be between 0.5 and 1.25V; however, other voltages may also be used. The comparator 610 may be a digital or analog comparator. Preferably, the comparator 610 is a multi-bit comparator.

As the TID increases, the resistance in the resistor 606 decreases. The resistance change in the resistor 606 causes the current through the resistor 606 to increase. As the current increases, the voltage Vtid increases. When Vtid exceeds Vref, Vout transitions from low to high. In this way, the circuit 600 may be used as a trip-level circuit to either indicate that an object has received too much or too little radiation. The circuit 600 may also be used to measure long-term exposure.

The signal Vout may be transmitted using circuitry formed in the radiation hardened area 502 of the die 500 as previously described with reference to FIG. 4.

Figure 7:
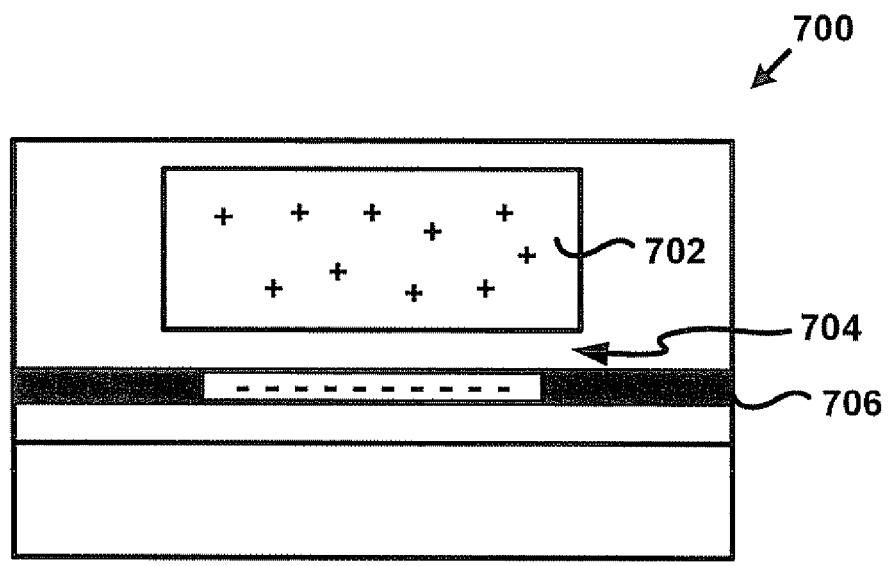
FIG. 7 is a side view of a die having a first area that is radiation hardened and a second area that is sensitive to radiation, according to another example.

Another example for forming a radiation sensitive area within a radiation hardened die is described with reference to FIG. 7. FIG. 7 is a side view of a die 700. In this example, an oxide layer 702 in an interconnect region 704 is sensitive to ionizing radiation. The oxide layer 702 may be damaged so that this layer 702 becomes sensitive. For example, the oxide layer 702 may be damaged using an ion implant as previously described or by using a capacitor with a high voltage.

Alternatively, a sensitive oxide may be deposited on a device layer 706 to form the oxide layer 702. A selective deposition technique, or a deposition and etch technique may be used to form the oxide layer 702. For example, the sensitive oxide may be a dielectric or other material used in fabricating the devices in the device layer 706.

By forming an ionizing radiation sensitive region in a radiation insensitive die, a radiation sensor may be fabricated on a single die with corresponding measurement circuitry. As a result, shielding or a second die for measurement circuitry are not necessary. In addition, support circuitry, including data transmission circuitry and memory, may also be formed on the same die.

Power may not be necessary for collecting and/or measuring the charge as the sensitive area is impacted by ionizing radiation. As a result, the radiation sensor may be described as a passive sensor. However, power may be needed for transmitting data.

The measured results may be transmitted to a monitoring location using wired or wireless techniques. As a result, a technician located in a control center may monitor whether foods and/or objects are receiving the necessary ionizing radiation dose. Additionally, the technician may monitor whether a person and/or an object receives too much radiation exposure. From this central location, the technician can take appropriate steps if the dosage is insufficient or excessive.

For example, the technician may monitor luggage at an airport as the luggage is screened using X-ray machines. The technician may be able identify luggage that has not been properly screened and stop the luggage from being placed on an aircraft until the luggage has been properly screened. In this example, the radiation sensors, once used, may be sent off-site to be regenerated.

The radiation hardened die containing the radiation sensitive area may be packaged using standard semiconductor packaging techniques. The type of packaging may be dependant on the type of ionizing radiation expected to be detected. For example, some packaging techniques may be appropriate for X-rays, while other packaging techniques may be appropriate for Gamma-rays.

It should be understood that the illustrated embodiments are examples only and should not be taken as limiting the scope of the present invention. For example, any circuit design may be used to measure property changes (e.g., voltage, current, resistance) of the sensitive area in the die. The claims should not be read as limited to the described order or elements unless stated to that effect. Therefore, all embodiments that come within the scope and spirit of the following claims and equivalents thereto are claimed as the invention.

We claim:

1. A radiation sensor formed on a single die, comprising in combination:
    a radiation hardened die; and
    a radiation sensitive area formed in the radiation hardened die, wherein a property of the radiation sensitive area changes when exposed to ionizing radiation, and wherein circuitry in a radiation hardened area of the radiation hardened die detects the property change.

2. The radiation sensor of claim 1, wherein the property of the radiation sensitive area that changes when exposed to the ionizing radiation is selected from the group consisting of charge density, threshold voltage, leakage current, and resistance.

3. The radiation sensor of claim 1, wherein the circuitry provides an output related to total ionizing dose.

4. The radiation sensor of claim 1, wherein the circuitry in the radiation hardened area includes circuitry for transmitting the detected property change to a device remote from the die.

5. The radiation sensor of claim 1, wherein the circuitry in the radiation hardened area includes a data storage device.

6. A method for fabricating a radiation sensor on a single die, comprising:
    providing a radiation hardened die;
    forming a radiation sensitive area in the radiation hardened die, wherein a property of the radiation sensitive area changes when exposed to ionizing radiation; and
    forming circuitry in a radiation hardened area of the radiation hardened die operable to detect the property change.

7. The method of claim 6, wherein forming a radiation sensitive area in the radiation hardened die includes damaging interconnect oxide by means of a masked implantation.

8. The method of claim 6, wherein forming a radiation sensitive area in the radiation hardened die includes electric field induced damage by means of a parallel plate capacitor in a metal stack.

9. The method of claim 6, wherein forming a radiation sensitive area in the radiation hardened die includes deposition of an ionizing radiation sensitive material on a die.

10. The method of claim 6, wherein forming a radiation sensitive area in the radiation hardened die includes deposition and etch of an ionizing radiation sensitive material on a die.

11. The method of claim 6, wherein forming a radiation sensitive area in the radiation hardened die includes assembly of an ionizing radiation sensitive material with the radiation hardened die using wafer to wafer bonding methods.

12. The method of claim 6, wherein forming a radiation sensitive area in the radiation hardened die includes assembly of an ionizing radiation sensitive material with the radiation hardened die using fluid fabrication methods.

13. A method for fabricating a radiation sensor on a single die, comprising:
    providing a radiation insensitive die;
    implanting ions in a portion of the radiation insensitive die forming an sensitive area in the radiation insensitive die; and
    forming circuitry in the radiation insensitive die operable to detect a property change in the sensitive area when exposed to radiation.

14. The method of claim 13, wherein a photoresist is used to implant the ions in the portion of the radiation insensitive die.

15. The method of claim 13, wherein the ion implantation causes a parasitic transistor to form in the sensitive area.

16. The method of claim 15, wherein the parasitic transistor causes threshold voltage to reduce as charge increases in the sensitive area, wherein the circuitry detects changes in the threshold voltage.

17. The method of claim 15, wherein the parasitic transistor causes leakage current to increase as charge increases in the sensitive area, wherein the circuitry detects changes in the leakage current.

18. The method of claim 13, wherein the ion implantation causes damage to an oxide layer under a device layer in the sensitive area.

19. The method of claim 18, wherein the damaged oxide layer cause a change in resistance as charge increases in the sensitive area, wherein the circuitry detects the change in resistance.

20. The method of claim 13, further consisting of forming circuitry operable to transmit the detected property change to a device remote from the radiation insensitive die.

* * * * *